(12) United States Patent
Zhao et al.

(10) Patent No.: US 9,147,033 B2
(45) Date of Patent: Sep. 29, 2015

(54) METHOD OF MAKING PHOTOMASK LAYOUT AND METHOD OF FORMING PHOTOMASK INCLUDING THE PHOTOMASK LAYOUT

(71) Applicant: United Microelectronics Corp., Hsinchu (TW)

(72) Inventors: Jie Zhao, Singapore (SG); Chia-Ping Chen, Taoyuan County (TW); Ching-Shu Lo, Singapore (SG); Hua-Biao Wu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 44 days.

(21) Appl. No.: 14/024,533

(22) Filed: Sep. 11, 2013

(65) Prior Publication Data

US 2015/0074620 A1    Mar. 12, 2015

(51) Int. Cl.
G06F 17/50    (2006.01)
G06F 17/30    (2006.01)

(52) U.S. Cl.
CPC .................................. G06F 17/5081 (2013.01)

(58) Field of Classification Search
CPC ..... G06F 17/30; G06F 17/50; H01L 27/0207; G03F 1/22; G03F 1/70
USPC ............ 716/53, 54, 57, 110; 430/5; 257/197, 257/774
See application file for complete search history.

(56) References Cited

U.S. PATENT DOCUMENTS

| | | | |
|---|---|---|---|
| 6,413,684 B1 * | 7/2002 | Stanton | 430/5 |
| 7,386,829 B2 * | 6/2008 | Lee | 716/53 |
| 7,446,294 B2 | 11/2008 | Lin | |
| 7,642,500 B2 | 1/2010 | Lin | |
| 2005/0142460 A1 * | 6/2005 | Lee | 430/5 |
| 2006/0085722 A1 * | 4/2006 | Watanabe et al. | 714/758 |
| 2006/0085772 A1 * | 4/2006 | Zhang | 716/4 |
| 2010/0042967 A1 * | 2/2010 | Dunn et al. | 716/19 |
| 2011/0057333 A1 * | 3/2011 | Di Giacomo et al. | 257/797 |
| 2011/0089344 A1 * | 4/2011 | Fujimura et al. | 250/492.22 |
| 2012/0054697 A1 * | 3/2012 | Takahata et al. | 716/55 |

* cited by examiner

*Primary Examiner* — Mohammed Alam
(74) *Attorney, Agent, or Firm* — J.C. Patents

(57) ABSTRACT

A method of making a photomask layout is provided. A graphic data of a photomask is provided. The graphic data includes at least one rectangular pattern. A correction step is performed to the graphic data by using a computer. The correction step includes adding a substantially ring-shaped pattern inside the rectangular pattern. A method of forming a photomask by using the photomask layout obtained by the said method is also provided. In an embodiment, the photomask is suitable for defining micro-lenses of a solid-state image sensor.

14 Claims, 5 Drawing Sheets

```
┌─────────────────────────────────────────────────┐
│ A graphic data of a photomask is provided,      │
│ wherein the graphic data includes at least one  │──10
│ rectangular pattern and a rectangular-ring      │
│ pattern surrounding the rectangular pattern     │
└─────────────────────────────────────────────────┘
                        │
                        ▼
┌─────────────────────────────────────────────────┐
│ A correction step is performed to the graphic   │
│ data by using a computer, wherein the correction│──20
│ step includes adding a substantially ring-shaped│
│ pattern and at least one assist pattern inside  │
│ the rectangular pattern                         │
└─────────────────────────────────────────────────┘
```

METHOD OF MAKING PHOTOMASK LAYOUT AND METHOD OF FORMING PHOTOMASK INCLUDING THE PHOTOMASK LAYOUT

BACKGROUND OF THE INVENTION

1. Field of Invention

The present invention relates to an integrated circuit (IC) fabrication, and particularly to a method of making a photomask layout and a method of forming a photomask including the photomask layout.

2. Description of Related Art

A solid-state image sensor, such as a CCD image sensor or CMOS image sensor (CIS), is essentially composed of red, green and blue pixel sensors that are respectively equipped with red, green and blue filters. To increase the quantum yield of incident light for improving the sensitivity, a micro-lens can be formed over each color filter to focus the incident light.

In a typical micro-lens process of a CIS device, a substrate having sensors, color filters and a planarization layer formed thereon is provided. A transparent photosensitive layer is formed on the planarization layer, and then a photomask having square patterns is used to pattern the photosensitive layer into islands. Thereafter, the islands are baked/melted and softened such that the tension makes their surfaces spherical, thus forming multiple micro-lenses. In such case, the shapes of the micro-lenses are sensitive to the heating condition during the baking/melting step.

SUMMARY OF THE INVENTION

Accordingly, the present invention provides a method of making a photomask layout and a method of forming a photomask including the photomask layout. The photomask of the invention can be used to define dome-shaped patterns (e.g. micro-lenses) with better profile.

The present invention provides a method of making a photomask layout. A graphic data of a photomask is provided. The graphic data includes at least one rectangular pattern. A correction step is performed to the graphic data by using a computer. The correction step includes adding a substantially ring-shaped pattern inside the rectangular pattern.

According to an embodiment of the present invention, the substantially ring-shaped pattern has a saw-toothed or jagged outline.

According to an embodiment of the present invention, the correction step further includes adding at least one assist pattern within the rectangular pattern and outside of the substantially ring-shaped pattern.

According to an embodiment of the present invention, the at least one assist pattern includes 4N substantially arc-shaped patterns, the 4N substantially arc-shaped patterns are respectively in four corner areas of the rectangular pattern, and N is 1 or more.

According to an embodiment of the present invention, each of the substantially arc-shaped patterns has a saw-toothed or jagged outline.

According to an embodiment of the present invention, the substantially arc-shaped patterns are disposed symmetrically with respect to a central point of the rectangular pattern or the substantially ring-shaped pattern.

According to an embodiment of the present invention, the graphic data further includes a rectangular-ring pattern surrounding the rectangular pattern.

According to an embodiment of the present invention, the correction step includes performing an optical proximity correction (OPC).

According to an embodiment of the present invention, the OPC is a model-based OPC.

According to an embodiment of the present invention, the OPC is a rule-based OPC.

According to an embodiment of the present invention, the OPC is executed manually.

According to an embodiment of the present invention, a borderline of the substantially ring-shaped pattern is connected with a borderline of the rectangular pattern.

According to an embodiment of the present invention, a borderline of the substantially ring-shaped pattern is not connected with a borderline of the rectangular pattern.

According to an embodiment of the present invention, the rectangular pattern is a square pattern.

According to an embodiment of the present invention, the substantially ring-shaped pattern is a circular pattern or an elliptic pattern.

The present invention further provides a method of forming a photomask by using the photomask layout obtained by the said method.

In view of the above, in the method of making a photomask layout of the invention, a substantially ring-shaped pattern and assist patterns are added to a square pattern at the OPC step. The photomask including the photomask layout can be used to define micro-lens patterns. The micro-lens patterns are less sensitive to the heating condition and therefore provide better profile after baking/melting.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
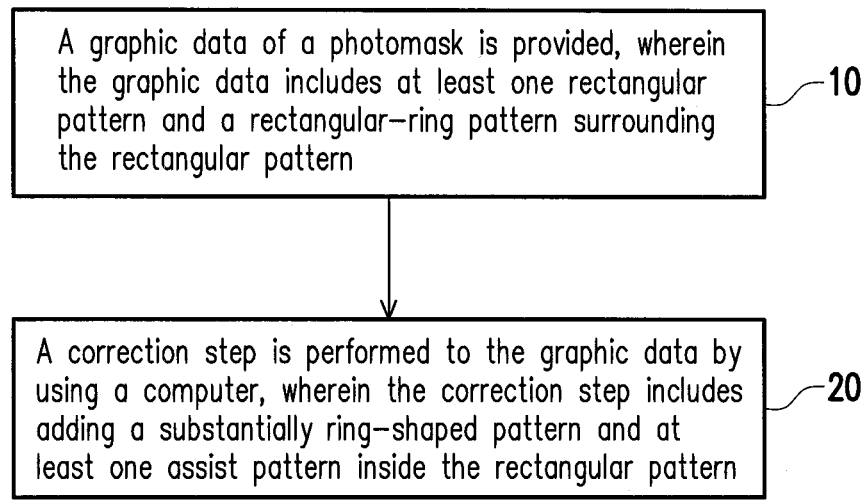
FIG. 1 illustrates a process flow of a method of making a photomask layout according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
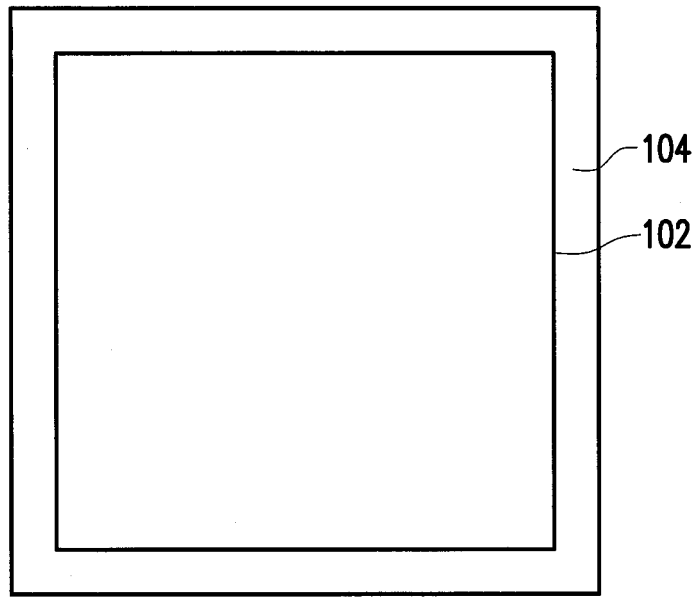
FIG. 2A to FIG. 2B are schematic views illustrating a method of making a photomask layout according to an embodiment of the present invention.
Figure 2B:
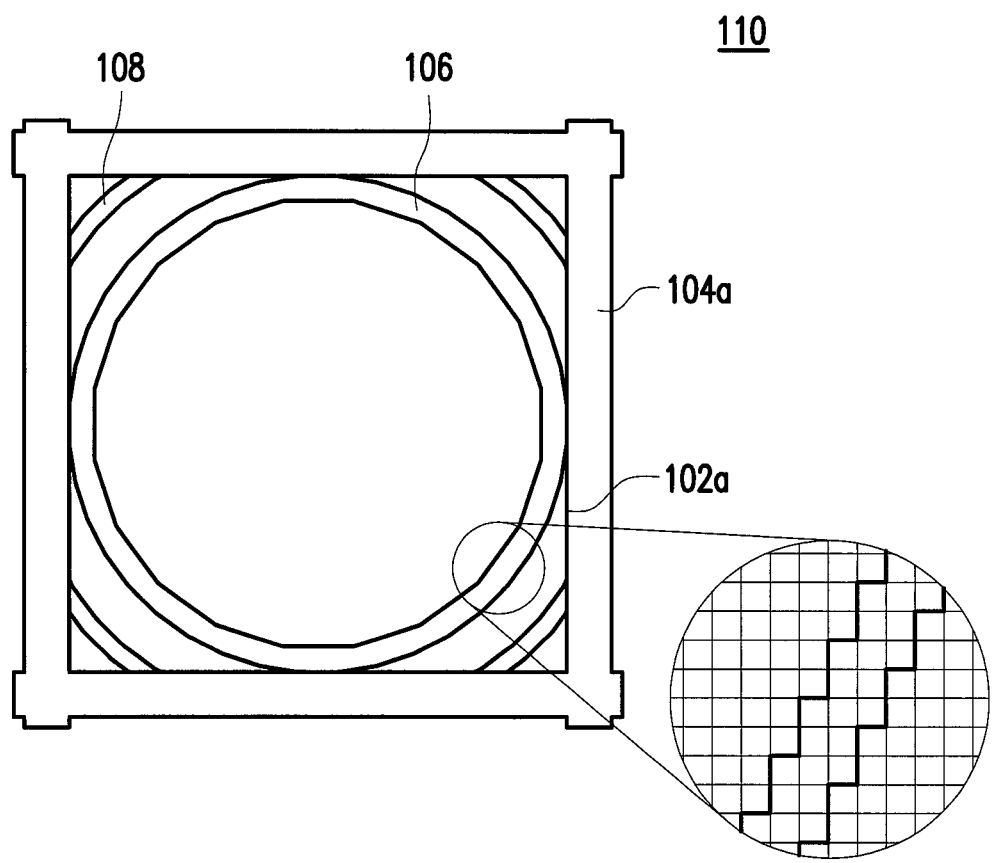

FIG. 1 illustrates a process flow of a method of making a photomask layout according to an embodiment of the present invention. FIG. 2A to FIG. 2B are schematic views illustrating a method of making a photomask layout according to an embodiment of the present invention.

Referring to FIG. 1 and FIG. 2A, in step 10, a graphic data 100 of a photomask is provided, and the graphic data 100 includes at least one rectangular pattern 102. The photomask is used in an IC process for defining micro-lenses of a CMOS image sensor (CIS) device, for example. The graphic data 100 is possibly made by an IC designer and stored in a GDS file. Besides, the graphic data 100 further includes a rectangular-ring pattern 104 surrounding the rectangular pattern 102. In an embodiment, the rectangular pattern 102 is a square pattern, and the rectangular-ring pattern 104 is a square-ring pattern, for example.

Referring to FIG. 1 and FIG. 2B, in step 20, a correction step is performed to the graphic data 100, by using a computer, to obtain a graphic data 110. The correction step includes adding a substantially ring-shaped (or annular) pattern 106 inside the rectangular pattern 102. The substantially ring-shaped pattern 106 can be a circular pattern or an elliptic pattern. In an embodiment, the rectangular pattern 102 and the substantially ring-shaped pattern 106 have the same central point.

The correction step includes performing an optical proximity correction (OPC) with an electronic design automation (EDA) software tool. OPC is a photolithography enhancement technique commonly used to compensate for image errors due to diffraction or process effects. OPC corrects these errors by moving edges or adding extra polygons to the pattern written on the photomask. This may be driven by pre-computed look-up tables based on width and spacing between features (known as a rule-based OPC) or by using compact models to dynamically simulate the final pattern and thereby drive the movement of edges, typically broken into sections, to find the best solution (known as a model-based OPC). In an embodiment, the OPC can also be executed manually.

It is noted that the substantially ring-shaped pattern 106 has a saw-toothed or jagged outline, as shown in the enlarge view at the bottom right corner of FIG. 2B. Specifically, the image of the ring-shaped pattern 106 is constituted by a bunch of tiny little squares (or called pixels). The computer is not able to display a smooth ring; pixels around a ring can only be part of the ring or not part of it. Therefore, the computer draws the ring as a jagged set of pixels roughly estimating the course/outline of the original smooth ring.

During the correction step in step 20, the rectangular pattern 102 and the rectangular-ring pattern 104 are corrected to a rectangular pattern 102a and a rectangular-ring pattern 104a to compensate for image errors due to diffraction or process effects.

Besides, in step 20, the correction step further includes adding at least one assist pattern within the rectangular pattern 102a and outside of the substantially ring-shaped pattern 106. In a photolithography process, the assist patterns can produce destructive interference to the light, and thus accurate features are formed on a substrate after exposure. Specifically, the assist patterns compensate for constructive interference of the light occurring between the rectangular-ring pattern 104a and the substantially ring-shaped pattern 106. The assist patterns can be written into a photomask, but light passing through the assist patterns does not substantially form a pattern in a photosensitive layer on a wafer.

In an embodiment, the at least one assist pattern includes 4N substantially arc-shaped patterns 108, the 4N substantially arc-shaped patterns 108 are respectively in four corner areas of the rectangular pattern 102a, and N is 1 or more. In other words, N substantially arc-shaped patterns 108 are disposed in one of the four corner areas of the rectangular pattern 102a. In an embodiment, the 4N substantially arc-shaped patterns 108 are disposed symmetrically with respect to a central point of the rectangular pattern 102a or the substantially ring-shaped pattern 106. Besides, each of the 4N substantially arc-shaped patterns 108 has a saw-toothed or jagged outline due to the said image display limitation.

Figure 3:
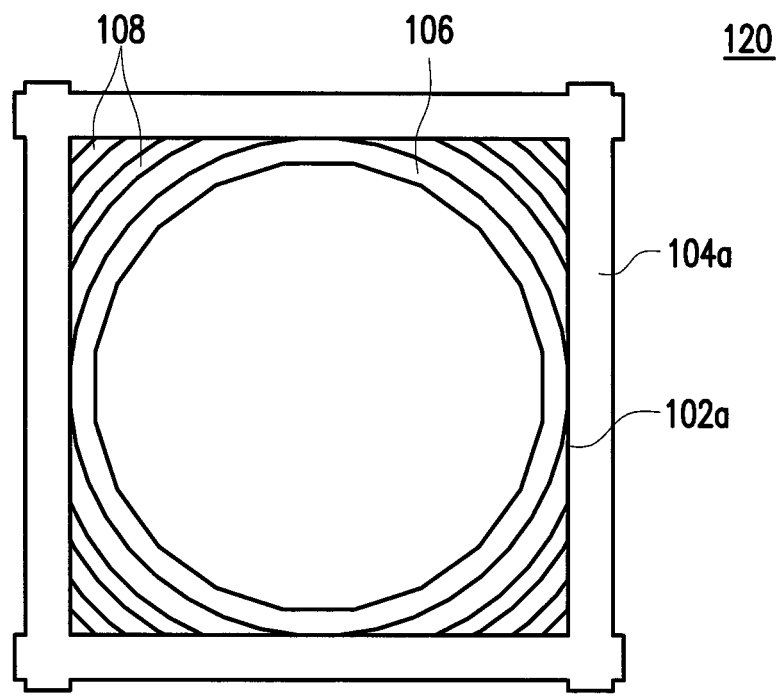
FIG. 3 is a schematic view illustrating a photomask layout according to another embodiment of the present invention.

In this embodiment, four substantially arc-shaped patterns 108 (N=1) are provided for illustration purposes, as shown in FIG. 2B, but the present invention is not limited thereto. In another embodiment, eight substantially arc-shaped patterns 108 (N=2) are provided, and two arc-shaped patterns 108 are provided at one corner of the rectangular pattern 102a, as shown in FIG. 3. In yet another embodiment, twelve substantially arc-shaped patterns 108 (N=3) or more can be provided upon the design/process requirements.

The said embodiments in which the borderline of the substantially ring-shaped pattern 106 is connected with the borderline of the rectangular pattern 102a (as shown in FIG. 2B and FIG. 3) are provided for illustration purposes and are not construed as limiting the present invention. In another embodiment, the borderline of the substantially ring-shaped pattern 106 is not connected with the borderline of the rectangular pattern 102a, as shown in FIG. 4.

Figure 4:
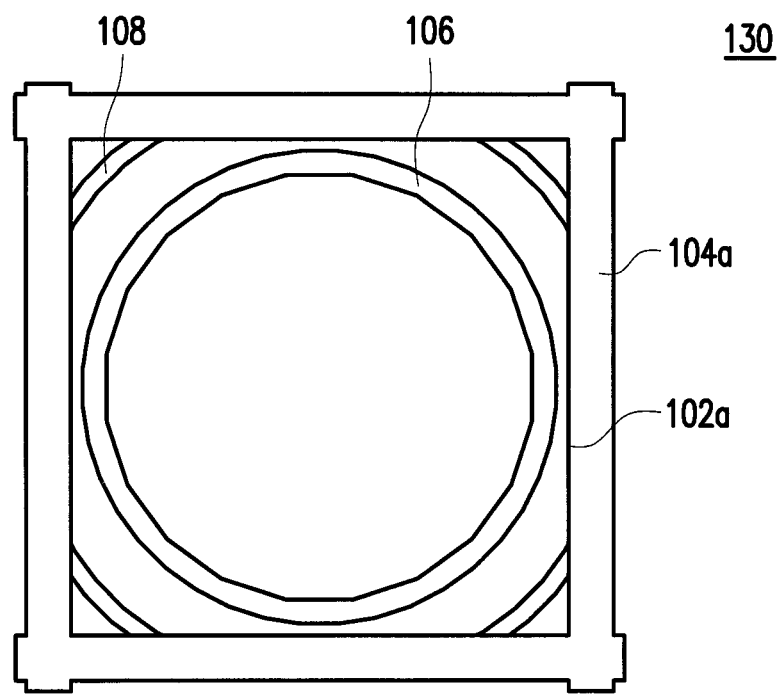
FIG. 4 is a schematic view illustrating a photomask layout according to yet another embodiment of the present invention.
Figure 5:
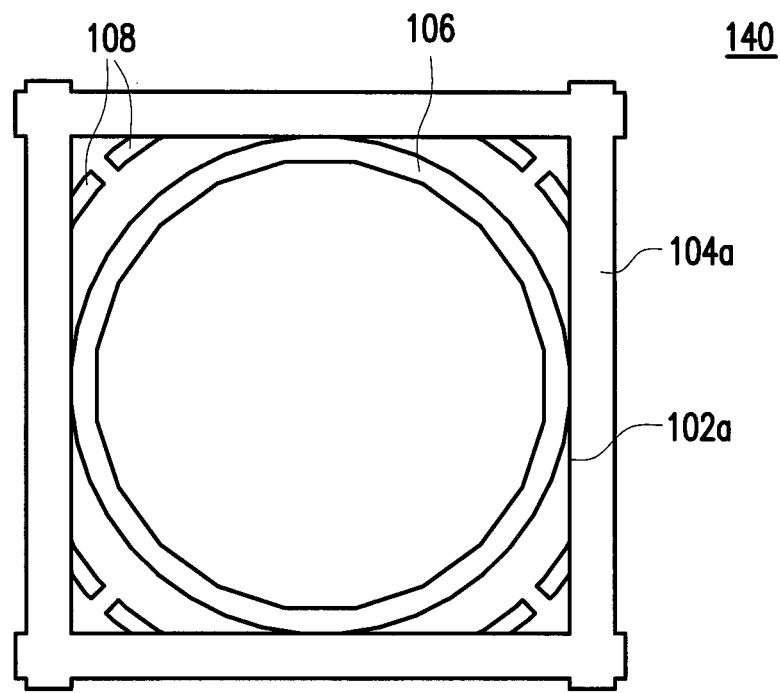
FIG. 5 is a schematic view illustrating a photomask layout according to still another embodiment of the present invention.

Besides, in the said embodiments, each of the arc-shaped patterns 108 is continuous, as shown in FIG. 2B, FIG. 3 and FIG. 4. However, the present invention is not limited thereto. In another embodiment, at least one or each of the arc-shaped patterns 108 can be discontinuous, as shown in FIG. 5.

Figure 6:
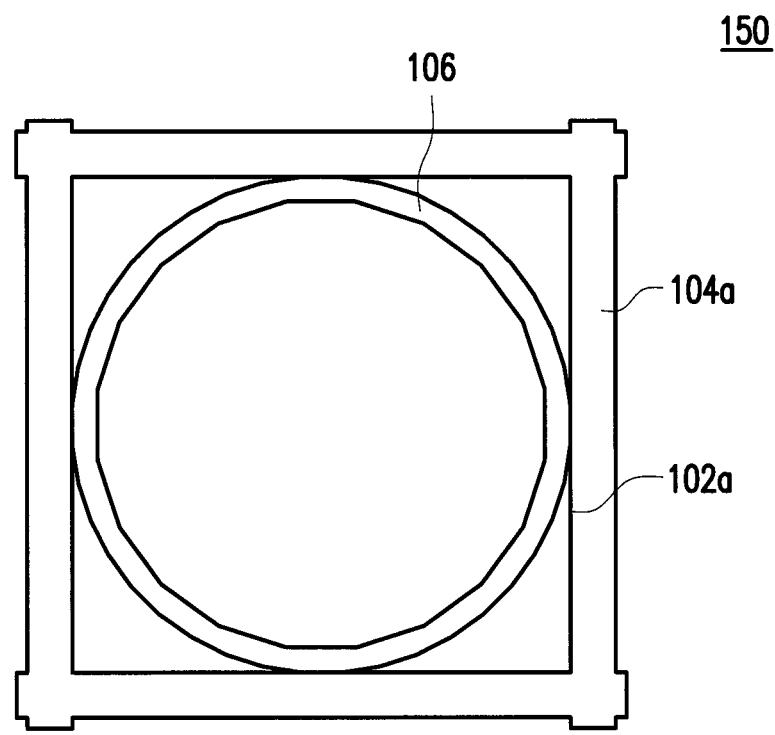
FIG. 6 is a schematic view illustrating a photomask layout according to another embodiment of the present invention.
Figure 7:
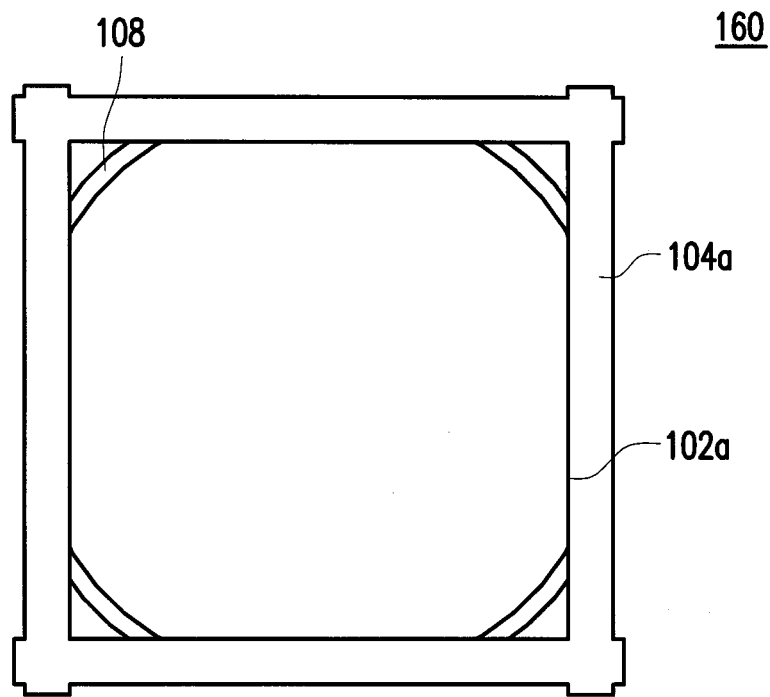
FIG. 7 is a schematic view illustrating a photomask layout according to another embodiment of the present invention.

Moreover, in the above embodiments, each photomask layout has a substantially ring-shaped pattern 106 and at least one assistant pattern 108, but the invention is not limited to this. One of the substantially ring-shaped pattern 106 and the assistant pattern 108 can be omitted upon the customers' requirements. In an embodiment, the assistant pattern 108 is omitted from the photomask layout, as shown in FIG. 6. In another embodiment, the substantially ring-shaped pattern 106 is omitted from the photomask layout, as shown in FIG. 7.

The present invention also provides a method of forming a photomask by using the photomask layout obtained by the method described above.

Figure 8:
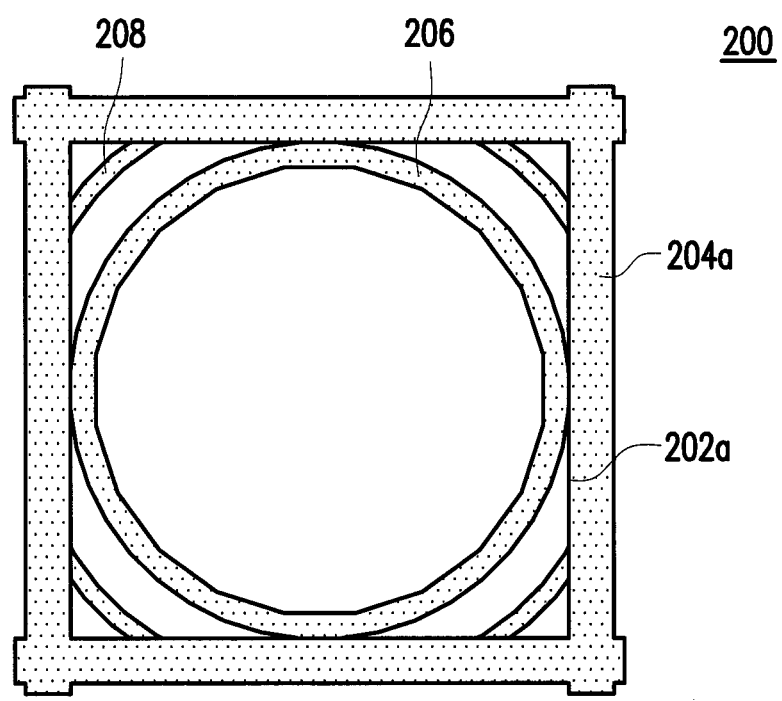
FIG. 8 is a schematic view illustrating a photomask according to an embodiment of the present invention.

Specifically, the graphic data 110 (or 120 or 130 or 140) as shown in FIG. 2B (or FIG. 3 or FIG. 4 or FIG. 5) are input to a photomask writing equipment. Thereafter, an electron beam (E-beam) or a laser is used to write the rectangular pattern 102a, the rectangular-ring pattern 104a, the ring-shaped pattern 106 and the assistant patterns (e.g. arc-shaped patterns 108) from the writing equipment into a photomask 200, as shown in FIG. 8. Afterwards, the photomask 200 can be applied to define micro-lens patterns of a solid-state image sensor. After micro-lens patterns are formed in a photosensitive layer on a wafer, a melting or baking step is performed to the micro-lens patterns to make their surfaces spherical, thus forming multiple micro-lenses.

The photomask 200 includes a rectangular feature 202a, a rectangular-ring feature 204a, a substantially ring-shaped feature 206 and substantially arc-shaped assist features 208, which respectively correspond to, for example, the positions of the rectangular pattern 102a, the rectangular-ring pattern 104a, the ring-shaped pattern 106 and the arc-shaped patterns 108 of the photomask layout in FIG. 2B. In an embodiment, when the photosensitive layer coated on the wafer is a positive photoresist layer, the rectangular feature 202a of the photomask 200 is made of a light-shielding material, and the rectangular-ring feature 204a, the ring-shaped feature 206 and the arc-shaped assist features 208 of the photomask 200 are made of a transparent material. In another embodiment, when the photosensitive layer coated on the wafer is a negative photoresist layer, the rectangular feature 202a of the photomask 200 is made of a transparent material, the rectangular-ring feature 204a, the ring-shaped feature 206 and the arc-shaped assist features 208 of the photomask 200 are made of a light-shielding material.

In summary, in the method of making a photomask layout of the invention, a substantially ring-shaped pattern and assist patterns are added to a square pattern at the OPC step. The photomask including the photomask layout can be used to define micro-lens patterns. The micro-lens patterns are less sensitive to the heating condition and therefore provide better profile after melting/baking.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a photomask by using a photomask layout, comprising steps of making the photomask layout:
providing a graphic data of a photomask, the graphic data comprising at least one rectangular pattern; and
performing a correction step to the graphic data by using a computer, wherein the correction step comprises adding a substantially ring-shaped pattern of an annular shape having a region bounded by two concentric circles forming an inner border and an outer border completely inside the rectangular pattern, and adding at least one assist pattern within the rectangular pattern and outside of the substantially ring-shaped pattern.

2. The method of claim 1, wherein the substantially ring-shaped pattern has a saw-toothed or jagged outline.

3. The method of claim 1, wherein the at least one assist pattern comprises 4N substantially arc-shaped patterns, the 4N substantially arc-shaped patterns are respectively in four corner areas of the rectangular pattern, and N is 1 or more.

4. The method of claim 3, wherein each of the substantially arc-shaped patterns has a saw-toothed or jagged outline.

5. The method of claim 3, wherein the substantially arc-shaped patterns are disposed symmetrically with respect to a central point of the rectangular pattern or the substantially ring-shaped pattern.

6. The method of claim 1, wherein the graphic data further comprises a rectangular-ring pattern surrounding the rectangular pattern.

7. The method of claim 1, wherein the correction step comprises performing an optical proximity correction (OPC).

8. The method of claim 7, wherein the OPC is a model-based OPC.

9. The method of claim 7, wherein the OPC is a rule-based OPC.

10. The method of claim 7, wherein the OPC is executed manually.

11. The method of claim 1, wherein a borderline of the substantially ring-shaped pattern is connected with a borderline of the rectangular pattern.

12. The method of claim 1, wherein a borderline of the substantially ring-shaped pattern is not connected with a borderline of the rectangular pattern.

13. The method of claim 1, wherein the rectangular pattern is a square pattern.

14. The method of claim 1, wherein the substantially ring-shaped pattern is a circular pattern or an elliptic pattern.

* * * * *